United States Patent [19]

Dixon

[11] Patent Number: 4,904,826
[45] Date of Patent: Feb. 27, 1990

[54] INTERNAL SHIELD GROUND ADAPTER FOR KICKPIPE/STUFFING TUBES

[75] Inventor: David S. Dixon, Old Lyme, Conn.

[73] Assignee: The United States of America as represented by the Secretary of the Navy, Washington, D.C.

[21] Appl. No.: 254,553

[22] Filed: Oct. 5, 1988

[51] Int. Cl.⁴ .................. H05K 9/00; H02G 15/013
[52] U.S. Cl. .................................. 174/35 R; 174/6; 174/65 SS
[58] Field of Search ........... 174/6, 35 R, 35 C, 65 SS, 174/78, 151; 439/92, 98, 100

[56] References Cited

U.S. PATENT DOCUMENTS

| | | | |
|---|---|---|---|
| 3,739,076 | 6/1973 | Schwartz | 174/65 SS X |
| 3,830,957 | 8/1974 | Oberdiear | 174/65 SS X |
| 4,547,623 | 10/1985 | Van Brunt et al. | 174/35 R |

FOREIGN PATENT DOCUMENTS

| | | | |
|---|---|---|---|
| 131239 | 4/1951 | Sweden | 174/65 SS |
| 1402861 | 8/1975 | United Kingdom | 174/65 SS |

OTHER PUBLICATIONS

Haigh, K. R., "Deep-Sea Cable-Gland System for Underwater Vehicles and Oceanographic Equipment", *Proceedings IEE*, vol. 115, No. 1, Jan. 1968, pp. 153-157.
Military Standard—1310D (Navy), Feb. 8, 1979, p. 32.

*Primary Examiner*—Laramie E. Askin
*Attorney, Agent, or Firm*—Prithvi C. Lall; Michael J. McGowan

[57] ABSTRACT

An internal shield ground adapter uses spring contacts inside the kickpipe/stuffing tube to make a wideband, low impedance 360 degree contact between the shield of a cable passing through the kickpipe/stuffing tube and the kickpipe/stuffing tube itself. An environmental seal compresses the spring contacts against both the cable shield and kickpipe/stuffing tube while preventing degradation of the system by environmentally sealing the area between the cable and kickpipe/stuffing tube.

8 Claims, 1 Drawing Sheet

INTERNAL SHIELD GROUND ADAPTER FOR KICKPIPE/STUFFING TUBES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention generally relates to electrical grounding equipment and more particularly to a shield ground adapter (SGA) designed to shunt high level electromagnetic (EM) energy from cable shields to a metallic boundary such as a kickpipe/stuffing tube (KP/ST) assembly, through which the cable passes. The EM energy can be caused by lightning or high level EM electromagnetic sources including the energy from an electromagnetic pulse (EMP). This shunting of EM energy from the cable shield to the metallic boundary, through which the cable passes, prevents the high level currents and voltages, with resulting EM fields, from penetrating into the space protected by the metallic boundary.

(2) Description of the Prior Art

Prior to the present invention all shield ground adapters utilized either soldered or spring type shield ground adapter devices that are located outside of the kickpipe/stuffing tube assembly. These devices were then screwed into the kickpipe/stuffing tube assemblies to obtain their required connections to the ground plane or metallic boundary.

With all of these devices, performance depends on the quality of the shield ground adapter to kickpipe/stuffing tube thread connection. It has been demonstrated that shield ground adapter performance, both in the laboratory and onboard a Naval ship, has been shown to degrade in performance (versus frequency and time) by over 120 dB. This makes the EM performance of existing shield ground adapters almost nonexistent only weeks after being screwed into the kickpipe/stuffing tube assembly.

As previously stated, all prior art shield ground adapter devices, known by applicant, are presently connected outside the kickpipe/stuffing tube assembly and require special mechanical assemblies to house the cable-to-shield ground adapter connection, and then the entire assembly must be environmentally sealed to prevent long term degradation of the shield ground adapter EM performance.

SUMMARY OF THE INVENTION

It is therefore an object of the present invention to provide an improved shield ground adapter that provides a wideband, 360 degree, low impedance connection between a shielded cable and a metallic boundary. This can be obtained by using either a soldered or spring compression method of connecting to the cable shield. It is a further object to eliminate all special shield ground adapter external assemblies. It is a further object to eliminate the most significant performance degrading aspect of prior art shield ground adapters; the shield ground adapter body to kickpipe/stuffing tube thread area.

The above objects are realized with a new shield ground adapter utilizing either one of two methods of connecting to the cable shield (soldered or spring compression). However, the connection between the cable shield and the metallic boundary is made inside of the kickpipe/stuffing tube assembly. The new shield ground adapter uses standard/existing MIL/SPEC kickpipe/stuffing tube gland nuts and gland seals to provide an environmental seal. The new SGA utilizes one or more iris compression rings or soldered shield contractors as well as a Belleville spring and a tapered washer to provide a very low impedance connection between the cable shield and the KP/ST assembly.

DESCRIPTION OF THE PREFERRED EMBODIMENTS

Figure 1:
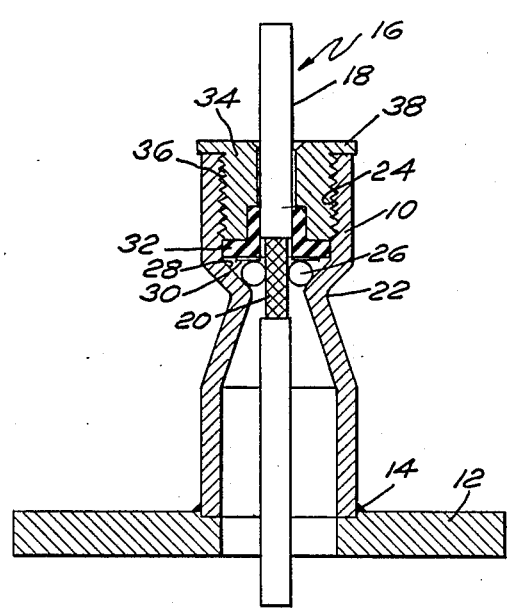
FIG. 1 shows a single iris ring version of an internal shield ground adapter for kickpipe/stuffing tubes in accordance with the present invention.

Referring now to FIG. 1 there is shown the single iris ring version of an internal shield ground adapter for kickpipe/stuffing tubes. The kickpipe/stuffing tube 10 is normally made of either aluminum or brass and is shown connected to a deck or metallic bulkhead 12 by means of welds 14. A shielded cable 16 passes through the kickpipe/stuffing tube 10 in the axial direction. The shielded cable 16 has a portion of its cable jacket 18 removed exposing a portion of its shield 20 inside the kickpipe/stuffing tube along its axial length.

The kickpipe/stuffing tube 10 comprises a segment of pipe having a shape similar to an hourglass tapering to a smaller circumference 22 at a portion intermediate both ends of the tube 10. The tube 10 has internal threads 24 at the end that is away from the connection to the deck or bulkhead 12.

A stainless steel or bronze iris ring 26 is seated inside the kickpipe/stuffing tube 10 abutting cable shield 20 and the tapered portion 28 of the tube 10. The iris ring 26 is compressed against both the cable shield 20 and the tapered portion 28 of tube 10 by means of a tin plated flat washer 30, a rubber gland ring 32 and an aluminum gland nut 34. This provides an excellent wideband, low impedance electrical connection between the shield 20 and the tube 10 and subsequently the metallic boundary 12 via the weld 14.

The gland nut 34 has outer threads 36 mating with internal threads 24 of tube 10. The gland nut 34 also has a lip 38 abutting the end of tube 10. When secured, the gland nut 34 compresses the gland ring 32 against the flat washer 30 that in turn compresses the iris ring 26 against both the cable shield 20 and the tapered portion 28 of tube 10. In addition, the gland nut 34 compresses the gland ring 32 against cable jacket 18 thereby providing an environmental seal along the length of the cable jacket 18 in the direction of the iris ring 26.

Figure 2:
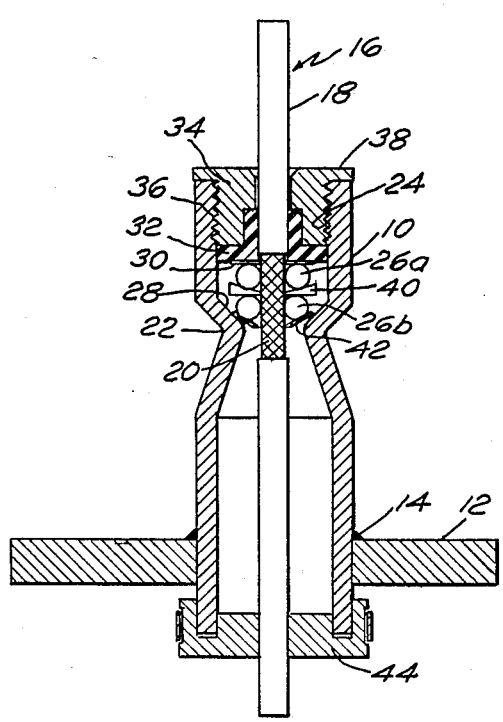
FIG. 2 shows a two iris ring version of an internal shield ground adapter for kickpipe/stuffing tubes with bottom electromagnetic interference (EMI) seal in accordance with the present invention.

The operation of the device of FIG. 2 is similar to that of FIG. 1. Similar components in FIG. 2 carry the same notation and operate similarly to those shown and described with reference to FIG. 1. Differences include the iris ring 26 of FIG. 1 being replaced by a plurality of iris rings 26a and 26b with a tapered metallic washer 40 in between. A tin coated brass or steel Belleville spring 42 is located between iris ring 26b and the tapered portion 28 of tube 10. The tube 10 extends through the plate 12 to an electromagnetic interference seal 44 to prevent electromagnetic energy from exiting the KP/ST assembly 10.

Figure 3:
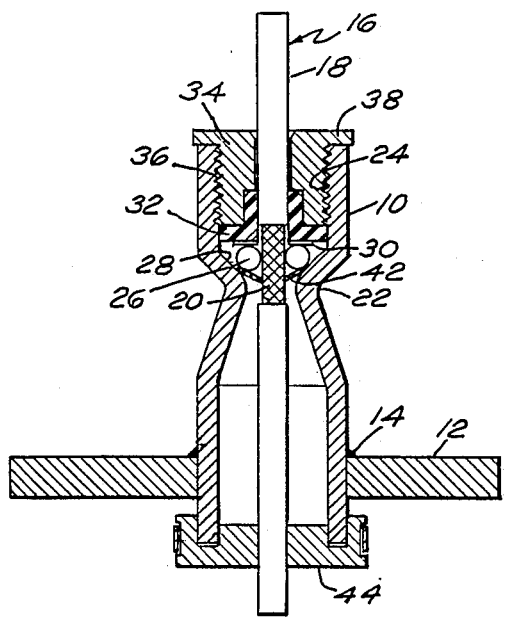
FIG. 3 shows a single iris ring version with bottom EMI seal of an internal shield ground adapter for kickpipe/stuffing tubes in accordance with the present invention.

The operation of the device of FIG. 3 is also similar to that of FIG. 1. Similar components in FIG. 3 carry the same notation and operate similarly to those shown and described with reference to FIG. 1. Differences comprise the system of FIG. 3 having its tube 10 extending through the plate 12 and also having a bottom electromagnetic interference seal 44 as described above. Also, the system of FIG. 3 differs from the system of FIG. 1 in the provision of a Belleville spring 42 between iris ring 26 and the tapered portion 28.

The Navy is presently imposing electromagnetic pulse (EMP) requirements on all Naval platforms. As this occurs, new and/or improved shield ground adapters will be required for dozens of cables on each Navy ship of all classes. The above-described shield ground adapter system provides an electromagnetic interference and an electromagnetic pulse grounding of the overall shield of the cable within the penetrating tube. The EMI/EMP grounding and environmental sealing is accomplished at very low cost compared to the prior art systems that use completely separate shield ground adapters located external to the penetrating tube for providing the electromagnetic pulse protection. These external shield ground adapters have failed due to environmental sealing problems and have to be repeatedly replaced at high cost.

It will be understood that various changes in details, materials, steps and arrangement of parts, which have been herein described and illustrated in order to explain the nature of the invention, may be made by those skilled in the art within the principle and scope of the invention as expressed in the appended claims.

What is claimed is:

1. An internal shield ground adapter system comprising:
   a plate having an aperture;
   a metallic tube of predetermined length having the opening at a first end of said predetermined length tapering to a smaller opening along a length segment of said tube, said tube extending through said plate with a portion of the outer surface of said tube affixed to the plate in the area surrounding said plate aperture, the second end of said tube extending beyond said plate;
   a shielded cable having a portion of its shield exposed, said shielded cable extending through said tube and said plate aperture;
   a metallic spring system contacting said exposed shield and the inner surface of said length segment of said tube that tapers to said smaller opening;
   compression and sealing means extending through said first end of said tube to compress said metallic spring system against both said shield and said inner surface of said tube in said length segment of said tube that tapers toward the smaller opening, and to environmentally seal the area between said first end of said tube and said shielding cable; and
   electromagnetic sealing means, comprising an electromagnetic interference seal affixed to the second end of said tube, and said electromagnetic interference seal together with said cable enclosing the second end of said tube, for preventing electromagnetic energy from exiting through the second end of said tube.

2. An internal shield ground adapter system according to claim 1 wherein said tube is a kickpipe.

3. An internal shield ground adapter system according to claim 2 wherein said metallic spring system comprises an iris.

4. An internal shield ground adapter system according to claim 3 wherein said kickpipe has internal threads at said first end.

5. An internal shield ground adapter system according to claim 4 wherein said compression and sealing means further comprises:
   a gland nut having outer threads mated to the inner threads of said kickpipe, said gland nut having a central aperture through which said shielded cable passes;
   a gland ring located inside said kickpipe abutting said gland nut and having force exerted on it by said gland nut so that is compresses said iris against said cable shield and the inner wall of said kickpipe in said segment that extends inwardly toward said smaller opening.

6. An internal shield ground adapter system according to claim 2 wherein said metallic spring system comprises a plurality of irises.

7. An internal shield ground adapter system according to claim 6 wherein said kickpipe has internal threads at said first end.

8. An internal shield ground adapter system according to claim 7 wherein said compression and sealing means further comprises:
   a gland nut having outer threads mated to the inner threads of said kickpipe, said gland nut having a central aperture through which said shielded cable passes;
   a gland ring located inside said kickpipe abutting said gland nut and having force exerted on it by said gland nut so that it compresses said irises against said cable shield and the inner wall of said kickpipe in said segment that extends inwardly towards said smaller opening.

* * * * *